United States Patent [19]

Foell et al.

[11] Patent Number: 4,481,235
[45] Date of Patent: Nov. 6, 1984

[54] APPARATUS AND METHOD FOR MANUFACTURING TAPE-SHAPED SILICON BODIES FOR SOLAR CELLS

[75] Inventors: Helmut Foell; Bernhard Freienstein; Karl Geim, all of Munich; Josef Grabmaier, Berg; Otmar Hintringer, Putzbrunn, all of Fed. Rep. of Germany

[73] Assignee: Siemens Aktiengesellschaft, Berlin and Munich, Fed. Rep. of Germany

[21] Appl. No.: 531,678

[22] Filed: Sep. 13, 1983

[30] Foreign Application Priority Data

Oct. 29, 1982 [DE] Fed. Rep. of Germany ....... 3240245

[51] Int. Cl.³ .................. B05D 5/12; B05D 1/18; B05C 3/12
[52] U.S. Cl. .................. 427/74; 427/75; 427/209; 427/210; 427/256; 427/434.7; 427/443.2; 118/401; 118/405; 118/420; 118/423; 118/429; 118/DIG. 18
[58] Field of Search .................. 427/74, 75, 209, 210, 427/443.2, 256, 434.2, 434.7; 118/401, 405, 419, 420, DIG. 18, 423, 429, 404; 156/608, DIG. 64, DIG. 84; 428/446

[56] References Cited

U.S. PATENT DOCUMENTS

| | | | |
|---|---|---|---|
| 3,491,675 | 1/1970 | Gold | 118/401 |
| 4,251,570 | 2/1981 | Zook | 427/74 |
| 4,252,861 | 2/1981 | Heaps et al. | 428/446 |
| 4,409,263 | 10/1983 | Aloisio, Jr. et al. | 118/405 |

FOREIGN PATENT DOCUMENTS 3036104 4/1981 Fed. Rep. of Germany.
3010557 9/1981 Fed. Rep. of Germany.

OTHER PUBLICATIONS

Belouet "The Growth of Polysilicon Sheets on Carbon Substrates by the RAD Process", Abstract No. 327, (1980).

Primary Examiner—Norman Morgenstern
Assistant Examiner—Robert J. Steinberger, Jr.
Attorney, Agent, or Firm—Hill, Van Santen, Steadman & Simpson

[57] ABSTRACT

A method and apparatus for manufacturing tape-shaped silicon bodies for solar cells wherein a tape-shaped reticulate carrier is passed vertically downwardly through a drawing nozzle including a slot which is full of molten silicon. The drawing nozzle is located above the level of molten silicon in a vat containing such molten silicon, and capillary means are provided to deliver the molten silicon from the vat into the drawing nozzle to fill the same with the molten silicon.

5 Claims, 2 Drawing Figures

APPARATUS AND METHOD FOR MANUFACTURING TAPE-SHAPED SILICON BODIES FOR SOLAR CELLS

BACKGROUND OF THE INVENTION

1. Field of the Invention

The present invention is in the field of manufacturing tape-shaped silicon bodies such as those employed in solar cells and relates specifically to an improved method and apparatus for applying controlled amounts of silicon to a reticulate body such as a mesh of a refractory material at improved speeds.

2. Description of the Prior Art

Coatings of carrier bodies containing molten silicon are known, for example, from German OS No. 30 10 557 A1 (U.S. Ser. No. 238,943, now abandoned) or from Abstract No. 327 by C. Belouet from the Electrochemical Meeting at St. Louis, May 11 through 16, 1980. In the first mentioned method, the coating is conducted relative to the drawing rate such that because of the high surface tension of the molten silicon, a thin layer less than 150 μm thick is formed in the meshes of the carrier body which consists of graphite or graphitized silica glass threads. The tape-shaped carrier body is conducted through a gap-shaped opening in a channel extending in the direction toward the melt surface and which is situated in the floor of a vat containing molten silicon. The gap-like opening is matched to the dimensions of the tape-shaped carrier. While it is possible to achieve uniform coating by means of this apparatus, the apparatus is only employable on a laboratory scale. The same is true of the method illustrated in FIG. 4 of the reference wherein the carrier body is moved past an opening disposed in the floor of the melt crucible, being moved past the same perpendicular relative to the opening and at a slight distance therefrom.

The second-named reference (Belouet) discloses a device wherein a carrier body consisting of a graphite ribbon is conducted through an opening situated in the floor of the melt crucible. This device has the danger that molten silicon will escape through the opening in the crucible floor and that the coating will thereby be interrupted.

An apparatus of the type initially discussed wherein a spilling of the molten silicon is suppressed has been proposed in German patent application No. P 32 17 686.4. This device is different from the prior art in that the coating location is isolated from the melt supply, and a higher thermal stability is thereby achieved at the drawing location. The transport of the carrier body occurs from bottom to top through a guide slot.

For a usable coating of a carrier body with silicon, there must not only be a problem-free drawing of the body through the molten silicon but, in addition, the geometry of the silicon meniscus at the exit location of the carrier body from the silicon melt should be controlled. Because the geometry of the meniscus can be varied within certain limits by means of a suitable design of the drawing nozzle, certain fundamental conditions such as the maximum meniscus height when drawing the carrier body from bottom to top can be varied only within very narrow limits. A fundamental limitation therefore exists which frequently can have a disadvantageous effect on the coating behavior.

A method for drawing a polycrystalline silicon layer on a carbonized ceramic substrate is known from German OS No. 30 36 104 A1 (U.S. Pat. Nos. 4,251,570 and 4,252,861) wherein the substrate is extracted from the silicon melt in an angle deviating from the vertical. The heating thereby takes place through the lower side which is still immersed and has not been coated. The growth rate of the silicon layer is increased by means of drawing obliquely up through the melt. An oblique drawing of surface silicon, however, is very involved and presents problems in terms of technology, particularly when the drawing is combined with an after-heating zone which is indispensable for fast drawing and for a high crystal quality of the silicon.

SUMMARY OF THE INVENTION

The present invention provides an apparatus and method for manufacturing surface silicon which exploits the advantages of a drawing nozzle as described in German patent application No. P. 32 17 686.4 and in addition permits the use of a greater multitude of possible geometries of the silicon meniscus at the exit location of the carrier body from the silicon melt.

In accordance with the present invention, this objective is achieved by transporting the tape-shaped carrier body from top to bottom through a drawing nozzle and positioning the drawing nozzle relative to the melt bath so that the coating location in the drawing nozzle is higher than the melt level in the melt vat.

In accordance with the present invention, the drawing nozzle may be designed geometrically and composed of suitable materials so that its discharge lips which form the slot in which the carrier body passes provide a meniscus level of the melt sufficient for filling the meshes of the carrier body with silicon at a high drawing rate.

In a particularly preferred form of the invention, the two lips which form the slot have different widths or, at least in the discharge opening, they consist of materials having different wetting properties relative to molten silicon. Graphite, for example, has a wetting angle of 30° and quartz has a wetting angle of approximately 90° with respect to molten silicon, and can be used in combination for this purpose.

Another feature of the invention resides in providing an entry opening for the drawing nozzle in the shape of a funnel so that discontinuous carrier bodies such as ceramic tapes can be easily introduced through the drawing nozzle.

BRIEF DESCRIPTION OF THE DRAWINGS

Further details of the improvements of the present invention will be made in conjunction with the attached sheet of drawings in which.

DESCRIPTION OF THE PREFERRED EMBODIMENTS

Figure 1:
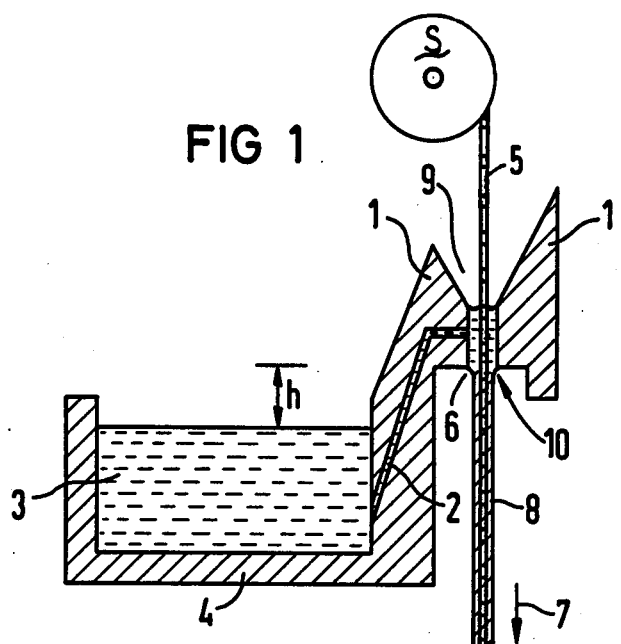
FIG. 1 is a schematic illustration to illustrate the overall principles of the present invention.

FIG. 1 shows the area of a coating location in which a drawing nozzle 1 shown in cross section is connected by means of capillaries 2 to a melt vat 4 which serves as a supply reservoir for the molten silicon 3. A tape-shaped graphite mesh 5 which serves as a carrier body and has a thickness matched to the discharge opening 6 of the drawing nozzle 1 and a mesh size, for example, of 5×5 mm² is drawn through the slot of the drawing nozzle 1 from top to bottom and is coated with silicon on both sides. The coated tape is identified at reference numeral 8. The introduction of the carrier body 5 into the drawing nozzle 1 is facilitated by means of a funnel-shaped inlet opening 9 leading to the slot. The tape-shaped mesh 5 is supplied from a supply reel S and is wound up on a driven take-up reel T.

The arrow 10 indicates the meniscus formation. Depending upon the height differential h between the top of the molten silicon bath 3 and the coating area in the drawing nozzle 1, the meniscus 10 can be varied within wide limits.

Figure 2:
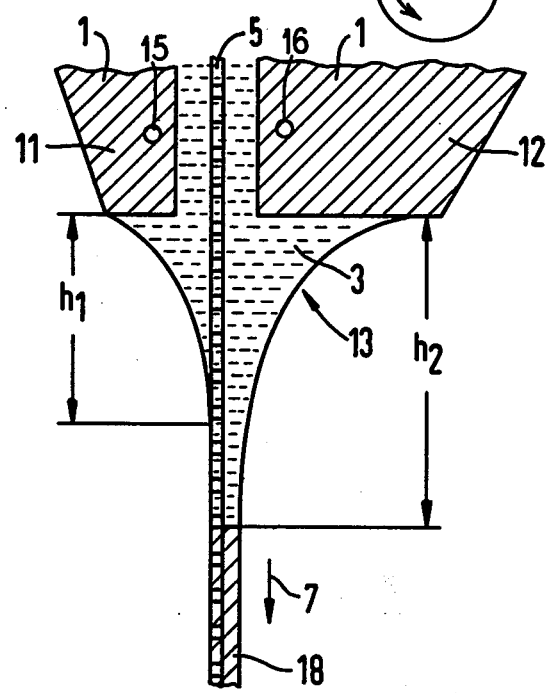
FIG. 2 is a greatly enlarged view of the discharge area of the drawing nozzle illustrating the manner in which the meniscus configuration can be controlled.

FIG. 2 illustrates a meniscus geometry which is formed by the lips 11 and 12 of a drawing nozzle 1 which has different widths at the exit location. An asymmetrical meniscus 13 is provided with different heights $h_1$ and $h_2$ on opposite sides of the tape carrier body 5. The maximum meniscus height measured from the lower edge of the coating location up to the contact location with the carrier body 5 is adjustable within wide limits. A meniscus height greater than 5 mm can easily be achieved. As can be seen from FIG. 2, the asymmetrical formation of the meniscus 13 consisting of heights $h_1$ and $h_2$ permits an asymmetrical coating of the carrier body 5 with silicon. The finished coated tape which in this instance has a thicker coating on the right side than on the left is identified with reference numeral 18.

The following sample embodiment illustrates typical conditions which can be used in practicing the present invention.

| Sample Embodiment | |
|---|---|
| Drawing velocity | 1 m/min |
| Width of drawing nozzle (1) | 10 cm |
| Width of slot (6) | 0.5 mm |
| Diameter of capillary (2) | 0.5 mm |
| Lip width (11, 12) | 0 mm (pointed lip) |
|  | 0.5 mm (broad lip) |
| Height (h) of coating location | 5 mm |
| Mesh size of carrier (5) | 5 × 5 mm$^2$ |
| Thread thickness of carrier (5) | 0.2 mm |

The lips 11 and 12 which cooperate to form the coating slot may be provided with separate temperature control means 15 and 16 such as resistance heaters or inductive heaters for controlling the temperature at the coating slot independently of the temperature of the molten silicon 3.

The following advantages are achieved by means of the apparatus and method of the present invention as compared to known devices. First, the drawing nozzle permits a spatial and thus thermal isolation of the silicon crystallization region from the melt vat. Consequently, the generation and regulation of temperature gradients in the crystallization area are significantly facilitated.

Depending upon the difference in height h between the silicon body and the coating area, the meniscus configuration can be varied within broad limits. As noted previously, the meniscus can be controlled to provide an asymmetrical formation on opposite sides of the carrier tape as it exits from the coating slot.

A discharge of molten silicon can reliably be avoided since the coating location lies higher than the melt level.

Finally, the feed of molten silicon through the capillaries into the slot of the drawing nozzle prevents the transport of solid contaminant particles, such as silicon carbide to the coating location.

It will be understood that various modifications can be made to the described embodiments without departing from the scope of the invention.

We claim as our invention:

1. An apparatus for manufacturing tape-shaped silicon bodies comprising:
   a vat for holding molten silicon therein,
   a vertically disposed drawing nozzle located outside the confines of said vat and above the level of molten silicon in said vat, said drawing nozzle including two lips which define a vertical slot therebetween, said lips being of different widths, capillary means arranged to deliver molten silicon from said vat into said drawing nozzle to fill the same with molten silicon, and
   means for drawing a reticulate tape-shaped carrier body downwardly through the molten silicon contained in said drawing nozzle.

2. An apparatus for manufacturing tape-shaped silicon bodies comprising:
   a vat for holding molten silicon therein,
   a vertically disposed drawing nozzle located outside the confines of said vat and above the level of molten silicon in said vat, said drawing nozzle including two lips which define a vertical slot therebetween, said lips being composed of materials having different wetting properties with respect to molten silicon,
   capillary means arranged to deliver molten silicon from said vat into said drawing nozzle to fill the same with molten silicon, and
   means for drawing a reticulate tape-shaped carrier body downwardly through the molten silicon contained in said drawing nozzle.

3. An apparatus according to claim 2 in which:
   said lips are composed of graphite and quartz, respectively.

4. An apparatus for manufacturing tape-shaped silicon bodies comprising:
   a vat for holding molten silicon therein,
   a vertically disposed drawing nozzle located outside the confines of said vat and above the level of molten silicon in said vat,
   temperature control means in said nozzle for adjusting the temperature of said nozzle independently of the temperature of said molten silicon in said vat,
   capillary means arranged to deliver molten silicon from said vat into said drawing nozzle to fill the same with molten silicon, and
   means for drawing a reticulate tape-shaped carrier body downwardly through the molten silicon contained in said drawing nozzle.

5. A method of impregnating molten silicon into a reticulate refractory tape which comprises:
   passing said tape downwardly through a vertical slot in a drawing nozzle having spaced lips,
   supplying molten silicon to said slot by capillary action from a supply of molten silicon located at a level below the level of said slot, and
   forming a meniscus of molten silicon on opposite sides of said tape as it leaves said slot, each meniscus being of different height.

* * * * *